United States Patent
Hussain et al.

(10) Patent No.: US 9,209,083 B2
(45) Date of Patent: Dec. 8, 2015

(54) INTEGRATED CIRCUIT MANUFACTURING FOR LOW-PROFILE AND FLEXIBLE DEVICES

(75) Inventors: Muhammad M. Hussain, Austin, TX (US); Jhonathan P. Rojas, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 14/232,211

(22) PCT Filed: Jul. 11, 2012

(86) PCT No.: PCT/US2012/046205
§ 371 (c)(1),
(2), (4) Date: Jan. 15, 2014

(87) PCT Pub. No.: WO2013/009833
PCT Pub. Date: Jan. 17, 2013

(65) Prior Publication Data
US 2014/0141571 A1    May 22, 2014

Related U.S. Application Data

(60) Provisional application No. 61/506,495, filed on Jul. 11, 2011.

(51) Int. Cl.
*H01L 21/00* (2006.01)
*H01L 21/78* (2006.01)

(52) U.S. Cl.
CPC ................................... *H01L 21/78* (2013.01)

(58) Field of Classification Search
USPC ............................ 257/618; 438/71, 114, 458
See application file for complete search history.

(56) References Cited

U.S. PATENT DOCUMENTS

| | | | | |
|---|---|---|---|---|
| 5,220,838 | A | 6/1993 | Fung et al. | 73/721 |
| 6,534,336 | B1 * | 3/2003 | Iwane et al. | 438/71 |
| 8,575,722 | B2 * | 11/2013 | Mitani et al. | 257/618 |
| 2002/0185469 | A1 | 12/2002 | Podlesnik et al. | 216/41 |
| 2005/0059219 | A1 * | 3/2005 | Tayanaka | 438/458 |
| 2005/0148147 | A1 | 7/2005 | Keating et al. | 438/299 |
| 2007/0096148 | A1 | 5/2007 | Hoentschel et al. | 257/192 |
| 2008/0050858 | A1 | 2/2008 | Ono et al. | |

(Continued)

OTHER PUBLICATIONS

International Search Report mailed Nov. 5, 2012, during examination of International Application No. PCT/US2012/046205.

(Continued)

*Primary Examiner* — Errol Fernandes
(74) *Attorney, Agent, or Firm* — Norton Rose Fulbright US LLP (57) ABSTRACT

A process for manufacturing low-profile and flexible integrated circuits includes manufacturing an integrated circuit on a wafer having a thickness larger than the desired thickness. After the integrated circuit is manufactured the integrated circuit may be released with a portion of the wafer leaving a remainder of the bulk portion of the wafer. A second integrated circuit may be manufactured on the remainder of the wafer and the process repeated to manufacture additional integrated circuits from a single wafer. The integrated circuits may be released from the wafer by etching vias through the integrated circuit and into the wafer. The via may be used to start an etch process inside the wafer that undercuts the integrated circuit separating the integrated circuit from the wafer.

20 Claims, 9 Drawing Sheets

(56) References Cited

U.S. PATENT DOCUMENTS

| | | |
|---|---|---|
| 2009/0096089 A1 | 4/2009 | Burghartz et al. |
| 2011/0000060 A1 | 1/2011 | Lee et al. |
| 2011/0092069 A1 | 4/2011 | Cheng et al. .................. 438/672 |

OTHER PUBLICATIONS

Shaw et al., "Scream I: A single mask, single-crystal silicon, reactive ion etching process for microelectromechanical structures", *Sensors and Actuators A.*, Jan. 1, 1994, vol. 40, No. 1, pp. 63-70.

Chhabra et al., 12.4% efficient freestanding 30mm ultra-thin silicone solar cell using a-Si/c-Si Heterostructure, *35th IEEE Photovoltaic Specialists Conference (PVCS)*, Jun. 20-25, 2010, Honolulu, Hawaii.

Huang et al., Fabrication of ultrathin P++ silicon microstructures using ion implantation and boron etch-stop, *Journal of Microelectromechanical Systems*, Dec. 1, 2001, vol. 10, No. 4, pp. 532-537.

Reiche et al., "Wafer Thinning. Techniques for Ultra-thin Wafers", *Solid State Technology*, 2003. Retrieved Apr. 24, 2015 from http://electroiq.com/blog/2003/03/wafer-thinning-techniques-for-ultra-thin-wafers/.

\* cited by examiner

INTEGRATED CIRCUIT MANUFACTURING FOR LOW-PROFILE AND FLEXIBLE DEVICES

CROSS-REFERENCE TO RELATED APPLICATIONS

This application is a national phase application under 35 U.S.C. §371 that claims priority to PCT Application No. PCT/US2012/046205 to King Abdullah University of Science and Technology filed Jul. 11, 2012, which claims priority to U.S. Provisional Application No. 61/506,495 filed Jul. 11, 2011, both of which are specifically incorporated herein by reference without disclaimer.

BACKGROUND OF THE INVENTION

1. Field of the Invention

This invention relates to integrated circuits and more particularly relates to manufacturing integrated circuits.

2. Description of the Related Art

Conventionally, integrated circuits are manufactured on thick semiconductor wafers. Semiconductor wafers such as silicon and gallium arsenide are preferred materials for integrated circuits because of their electrical properties. Thick wafers are conventionally preferred for their ability to withstand the processing and handling required to manufacture integrated circuits on the semiconductor wafers. The thickness of the semiconductor wafers may be significantly reduced with little impact to the electronic behavior of the integrated circuit built on the wafers. In fact, manufacturing on thin wafers may be preferred over thick wafers due to lower cost of materials and the lower profile of the devices incorporating the integrated circuits manufactured on thin wafers. For example, smaller and more flexible devices may be manufactured on thin wafers. However, manufacturing integrated circuits on thin wafers presents problems with poor yield due to the fragility of the thin wafers.

Figure 1A:
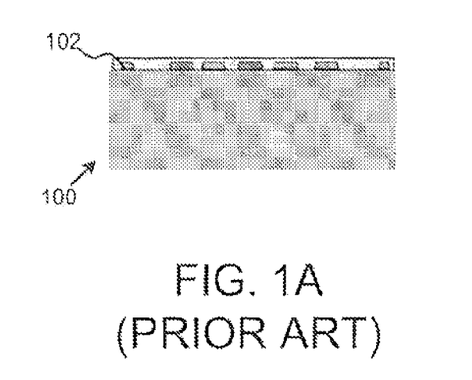
FIGS. 1A and 1B are block diagrams illustrating manufacturing integrated circuits on thin wafers using a conventional backgrinding method.
Figure 1B:
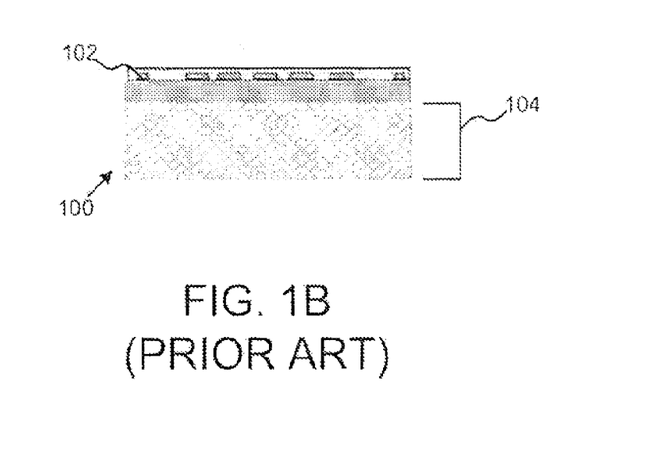

One conventional solution for manufacturing integrated circuits on thin wafers is backgrinding the wafer as illustrated in FIGS. 1A and 1B. FIG. 1A illustrates a wafer 100 having devices 102 comprising an integrated circuit. The devices 102 are manufactured according to conventional methods on the wafer 100. After manufacturing is complete the wafer 100 is backgrinded through section 104 to reduce the thickness of the wafer 100. Although the end product is an integrated circuit on a thin wafer, a significant amount of the wafer was destroyed during the backgrinding. Thus, the cost of the integrated circuit of FIG. 1A is higher than a conventional thick wafer because the same amount of material was consumed in manufacturing and the manufacturing included additional steps compared to conventional manufacturing of integrated circuits on thick wafers.

Figure 2A:
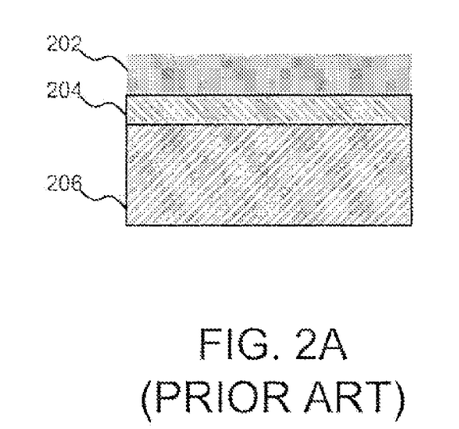
FIGS. 2A and 2B are block diagrams illustrating manufacturing integrated circuits on thin wafers using a conventional carrier wafer method.
Figure 2B:
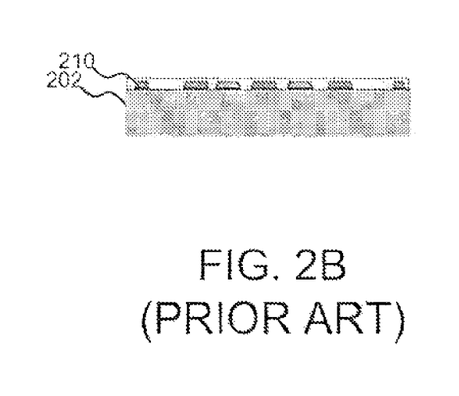

Another conventional solution for manufacturing integrated circuits on thin wafers is through use of a carrier wafer as illustrated in FIGS. 2A and 2B. In FIG. 2A a thin wafer 202 is attached to a carrier wafer 206 through an adhesive 204. Manufacturing of integrated circuits on the thin wafer 202 is substantially similar to conventional manufacturing on thick wafers because the carrier wafer 206 provides support for the thin wafer 202. After devices 210 are manufactured on the thin wafer 202 the thin wafer 202 is released from the carrier wafer 206 as shown in FIG. 2B. Although the final product is an integrated circuit manufactured on a thin wafer, the manufacturing process is more costly due to the additional materials and processing steps involved in attaching and detaching the carrier wafer. Additionally, some conventional manufacturing processes have to be adapted to prevent early dissolution of the adhesive 204. For example, the adhesive 204 should not be exposed to high temperatures or certain chemicals. Further, additional cleaning steps may be necessary to remove residue of the adhesive 204 from the thin wafer 202.

In addition to having low profiles suitable for mobile devices, thin wafers may also allow manufacturing flexible electronics. Conventional solutions for manufacturing flexible electronics involve manufacturing devices on organic substrates such as polymers or depositing semiconductor layers on polymers. However, devices manufactured on polymers may have different electrical characteristics than devices manufactured on conventional semiconductor wafers because the electronic characteristics of the polymers or the crystal structure of semiconductors deposited on polymers are different than conventional semiconductor wafers.

SUMMARY OF THE INVENTION

A method for manufacturing is presented. In one embodiment, the method includes manufacturing an integrated circuit on at least a portion of a surface of a wafer. The method also includes etching at least one via into the wafer. The method further includes releasing at least the portion of the wafer having the manufactured integrated circuit from a bulk portion of the wafer.

Another method for manufacturing is presented. In one embodiment, the method includes manufacturing a first integrated circuit on a wafer. The method also includes releasing a first thickness of the wafer including the first integrated circuit from the wafer. The method further includes manufacturing a second integrated circuit on the wafer. The method also includes releasing a second thickness of the wafer including the second integrated circuit from the wafer.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

FIGS. 3A-3F are block diagrams illustrating an exemplary manufacturing process for manufacturing low-profile integrated circuits according to one embodiment of the disclosure.

FIGS. 5A-5D are block diagrams illustrating an exemplary manufacturing process for manufacturing multiple low-profile integrated circuits from a single wafer according to one embodiment of the disclosure.

DETAILED DESCRIPTION

Various features and advantageous details are explained more fully with reference to the non-limiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

A method of manufacturing low-profile integrated circuits on conventional semiconductor wafers is presented that results in a reduced waste of materials, reduced impact on other manufacturing processes, and reduced cost. Manufacturing of an integrated circuit may be performed on a wafer according to conventional or other processes. The wafer may have a sufficient thickness to withstand the manufacturing processes. After the integrated circuit is manufactured on the wafer a top portion of the thickness of the wafer, including the integrated circuit, may be released from the wafer. According to one embodiment, the top portion of the wafer may be released through an undercut technique. The released top portion of the wafer is an integrated circuit having a low-profile. The low-profile integrated circuit may be used, for example, to create mobile devices or another device having a small form factor. The low-profile integrated circuit may also be used in flexible electronics. The remaining portion of the wafer may be recycled and another integrated circuit manufactured on the top of the remaining portion of the wafer. This integrated circuit may be released from the wafer and the process of additional manufacturing integrated circuits may continue on the wafer.

Figure 3A:
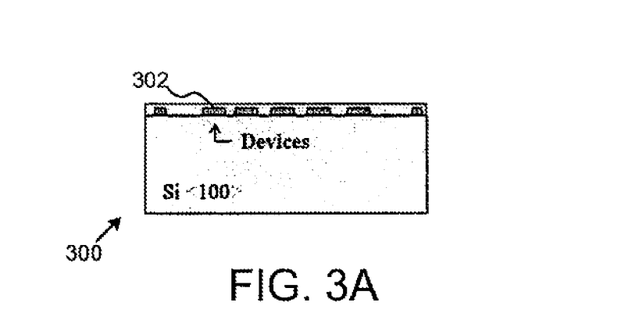

FIGS. 3A-3F are block diagrams illustrating an exemplary manufacturing process for manufacturing low-profile integrated circuits according to one embodiment of the disclosure. The block diagrams of FIGS. 3A-3F will be described with reference to FIG. 4, which is a flow chart illustrating an exemplary manufacturing process for manufacturing low-profile integrated circuits according to one embodiment of the disclosure. A method 400 for manufacturing a low-profile integrated circuit beings at block 402 with manufacturing an integrated circuit on a wafer. FIG. 3A is a block diagram illustrating a wafer 300 after manufacturing an integrated circuit having devices 302. According to one embodiment, the wafer 300 may be a silicon wafer having a crystal orientation of <100>. However, the wafer 300 may be other materials such as gallium arsenide. According to one embodiment, the wafer 300 may be a conventional thickness wafer. However, the wafer 300 may be any wafer having a thickness greater than the desired thickness of the integrated circuit.

Figure 3B:
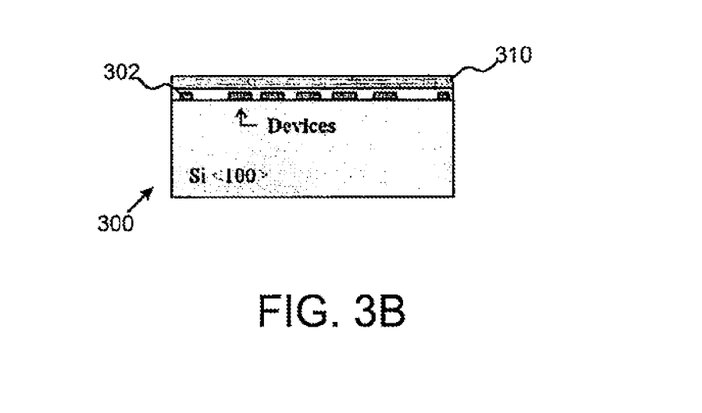

At block 404 a protective layer is deposited on the wafer 300. FIG. 3B is a block diagram illustrating the wafer 300 after a protective layer 310 is deposited on the wafer 300. The protective layer 310 may be, for example, a conformally deposited layer of silicon oxide ($SiO_x$) or silicon nitride ($SiN_x$). The protective layer 310 may be deposited by chemical vapor deposition (CVD), physical vapor deposition (PVD) such as sputtering, atomic layer deposition (ALD), and/or electrodeposition. The protective layer 310 may also include multiple materials. For example, the protective layer 310 may include a layer of silicon oxide and a layer of silicon nitride. The protective layer 310 may be used as a hard mask for later etching processes. Thus, the material for the protective layer 310 may be selected according to the material of the wafer 300 and the etching process to obtain a desired etching ratio of the protective layer 310 to the wafer 300.

Figure 3C:
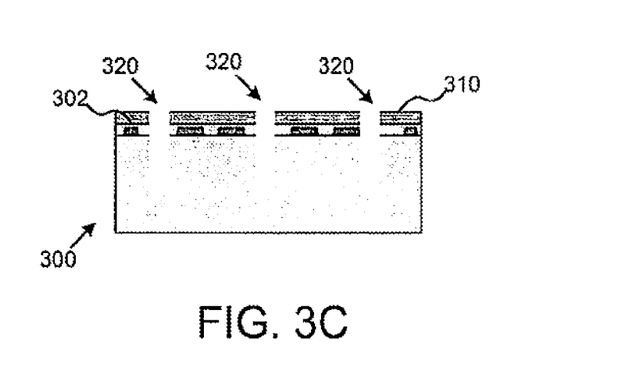

At block 406 at least one via is etched into the wafer. FIG. 3C is a block diagram illustrating the wafer 300 after vias 320 are etched into the wafer 300. The vias 320 may be created by first patterning the protective layer 310 and then performing a deep reactive ion etch (DRIE) of the wafer 300 using the patterned protective layer 310 as a hard mask. According to one embodiment, a photoresist layer (not shown) is used to pattern the protective layer 310. Any photoresist remaining after patterning the protective layer may also be used as a mask for patterning the vias 320. The depth of the vias 320 may be selected based, in part, on the desired thickness for the released portion of the wafer 300. According to one embodiment the vias 320 are designed to extend through a region of the wafer 300 between the devices 302. According to another embodiment, the vias 320 may be designed around the integrated circuit having the devices 302. For example, the vias 320 may form a pattern around the edges of the integrated circuit made up by the devices 302. According to one embodiment, the vias 320 may be formed with only one additional photomask. Additionally, the vias 320 may form a pattern in the center of the integrated circuit made up by the devices 302. In this embodiment, the layout of the devices 302 may remain substantially the same as when manufactured with other processes.

Figure 3D:
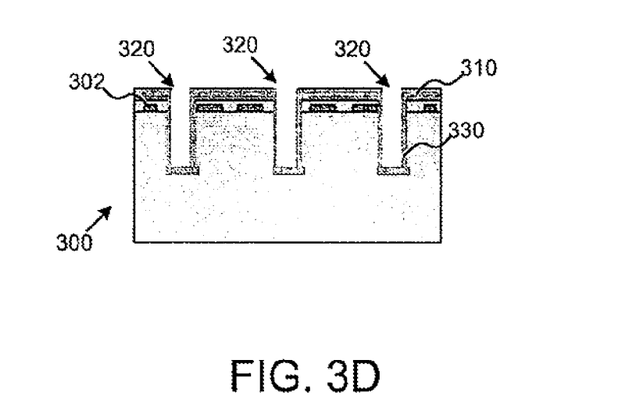

At block 408 a barrier layer is deposited in the at least one via. FIG. 3D is a block diagram illustrating the wafer 300 after a barrier layer 330 is deposited in the vias 320. The barrier layer 320 may be silicon dioxide. According to one embodiment, the barrier layer 320 is grown by thermally oxidizing the wafer 300. The barrier layer 320 may also be deposited through other techniques such as CVD, PVD, ALD, and/or electrodeposition.

Figure 3E:
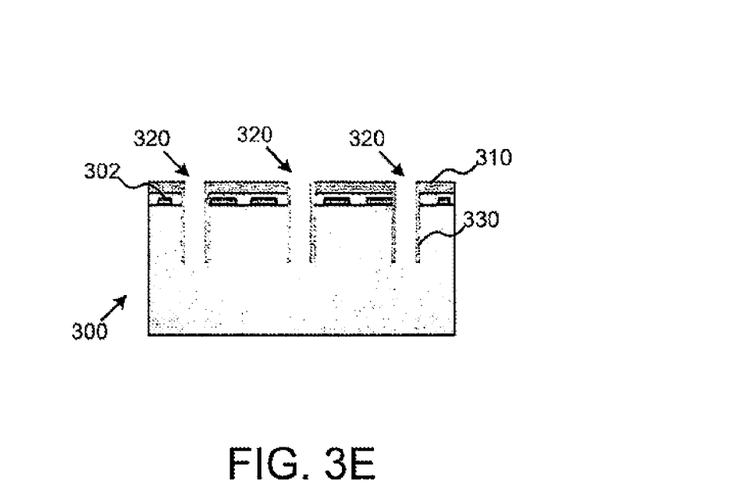

At block 410 the barrier layer is removed from a bottom surface of the at least one via. FIG. 3E is a block diagram illustrating the wafer 300 after the barrier layer 330 is removed from a bottom surface of the vias 320. According to one embodiment, a highly directional etch, such as reactive ion etching (RIE) at low pressure and high energy may be used for removing the barrier layer 330 from the bottom surface of the vias 320. After the barrier layer 330 is removed from the bottom surface of the vias 320 the bulk potion of the wafer 300 is exposed.

Figure 3F:
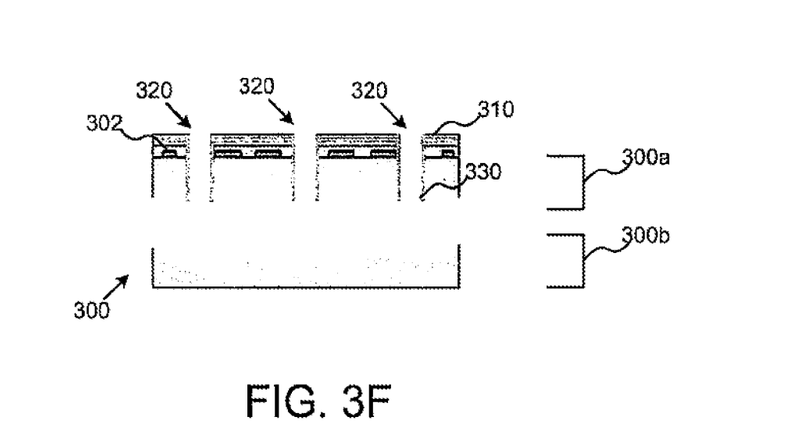

At block 412 a portion of the wafer having the integrated circuit is released from the wafer. FIG. 3F is a block diagram illustrating the wafer 300 after etching the wafer 300 through the vias 320. An isotropic etch of the wafer 300 through the bottom surface of the vias 320 after removing the barrier layer 330 results in etching of the wafer 300 in all directions at a substantially similar rate. After a period of time, the etching starting from the bottom surface of at each of the vias 320 intersects causing a top portion 300a of the wafer 300 to detach from a bottom portion 300b. According to one embodiment, isotropic etching is performed with xenon difluoride ($XeF_2$). According to another embodiment, a wet isotropic etch may be performed. According to yet another embodiment, the wafer 300 may include a boron doped buried region (not shown), which may act as an etch stop during etching of the wafer 300. Although isotropic etching is described with reference to the embodiment of FIG. 3F, anisotropic etching may be used in other embodiments. According to one embodiment, an anisotropic etch of the wafer 300 may be performed. For example, if the wafer 300 is silicon with a <111> crystal orientation then a potassium hydroxide (KOH) etch may be used.

The top portion 300a of the wafer 300 may be further processed to create an electronic device. For example, the top portion 300a may be packaged. Because the top portion 300a has a low-profile the integrated circuit comprising the devices 200 may be suitable for small form factor devices such as mobile phones. Additionally, the integrated circuit may be employed in flexible electronics. Because the low-profile integrated circuit was manufactured from a conventional thickness wafer little to no alteration of the manufacturing process for the integrated circuit may be necessary. Instead, in the conventional manufacturing processes for thin wafers well-understood manufacturing processes are adapted to account for thin wafers or carrier wafer adhesives.

The exemplary manufacturing process described above for low-profile integrated circuits also allows recycling of the wafer materials. For example, after the top portion 303a is removed from the wafer 300, the bottom portion 303b may be used for manufacturing additional integrated circuits. According to one embodiment, additional circuits may be manufactured on the bottom portion 303b and packaged as another electronic device. A polishing step may be performed to remove roughness from the wafer 300 after each portion of the wafer 300 is released. For example, the bottom portion 303b may be polished before additional integrated circuits are manufactured on the bottom portion 303b. According to another embodiment, additional circuits may be manufactured on the bottom portion 303b and released from the wafer 300 similar to the top portion 303a.

Figure 5A:
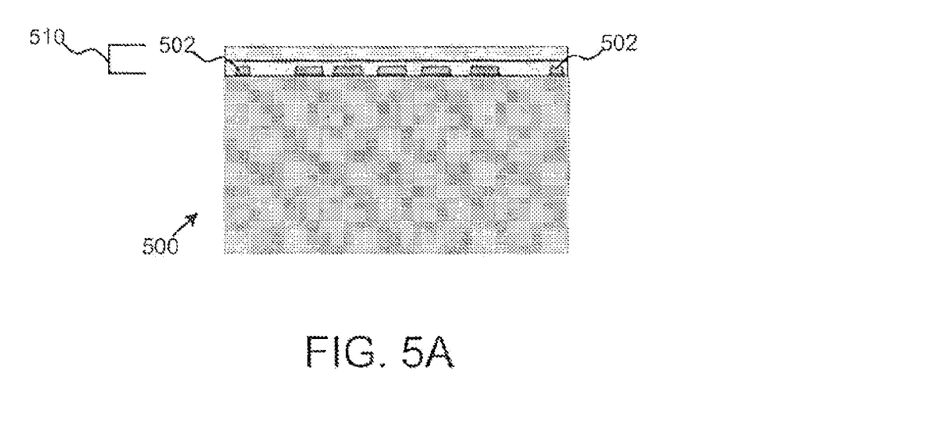

FIGS. 5A-5D are block diagrams illustrating an exemplary manufacturing process for manufacturing multiple low-profile integrated circuits from a single wafer according to one embodiment of the disclosure. The block diagrams of FIGS. 5A-5D will be described with reference to FIG. 6, which is a flow chart illustrating an exemplary manufacturing process for manufacturing multiple low-profile integrated circuits from a single wafer according to one embodiment of the disclosure. A method 600 begins at block 602 with manufacturing a first integrated circuit on a wafer. FIG. 5A is a block diagram illustrating a first integrated circuit 510 having devices 502 manufactured on a wafer 500.

At block 604 a first thickness of the wafer is released from the wafer such that the first integrated circuit 510 and devices 502 are separated from the wafer 500. FIG. 5B is a block diagram illustrating a first thickness 500a of the wafer 500, including the first integrated circuit 510, released from the wafer 500. The first thickness 500a may be released through patterning vias and etching the wafer 500 as described above with reference to FIGS. 3A-3F and 4.

Figure 6:
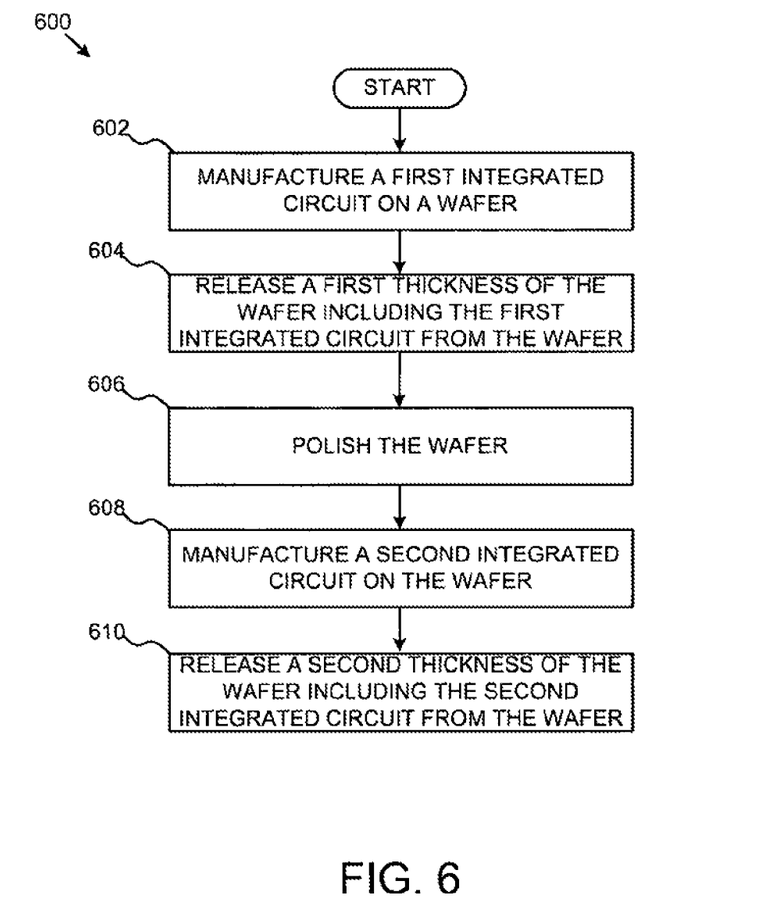
FIG. 6 is a flow chart illustrating an exemplary manufacturing process for manufacturing multiple low-profile integrated circuits from a single wafer according to one embodiment of the disclosure.

At block 606 the wafer may be polished to improve electrical properties and yield of manufactured devices on the remaining portion of the wafer 500.

Figure 5B:
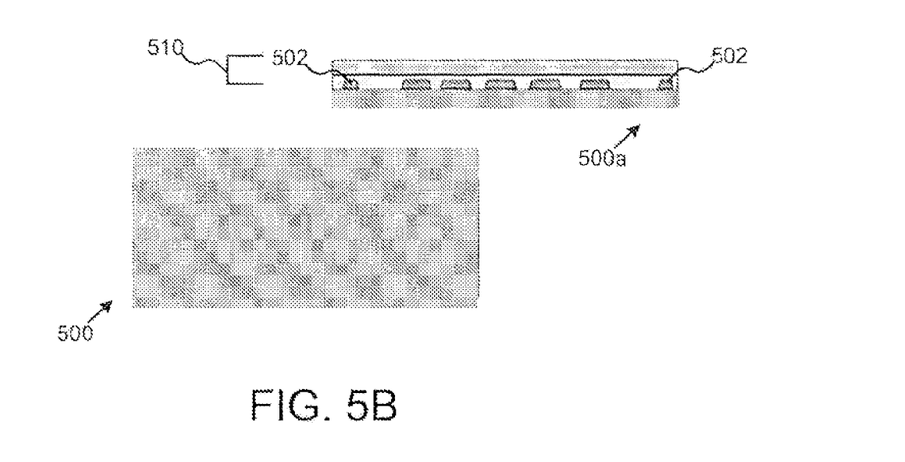
Figure 5C:
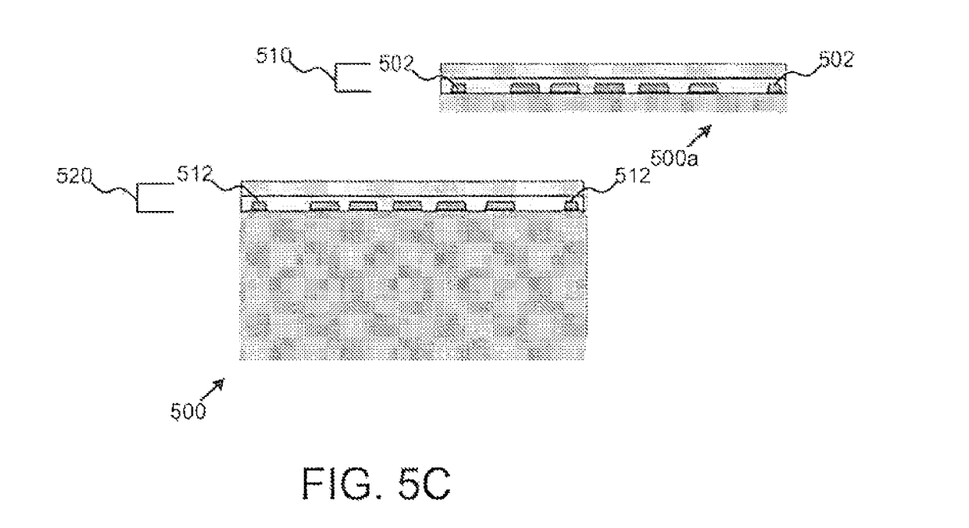

At block 608 a second integrated circuit is manufactured on the wafer. FIG. 5C is a block diagram illustrating a second integrated circuit 520 having devices 512 manufactured on the wafer 500. The second integrated circuit 520 may be the same circuit as the first integrated circuit 510 or a different circuit.

At block 610 a second thickness of the wafer is released from the wafer such that the second integrated circuit is separated from the wafer. FIG. 5D is a block diagram illustrating a second thickness 500b of the wafer 500, including the second integrated circuit 520, released from the wafer 500. The release may be performed through a method as described above with reference to FIGS. 3A-3F and 4.

The method 600 may continue by manufacturing additional integrated circuits from the wafer and releasing the additional integrated circuits from the wafer. The method 600 may continue until the wafer is depleted and there is insufficient wafer remaining to manufacture additional integrated circuits. According to one embodiment, the released first integrated circuit and second integrated circuit may be packaged together in a stacked integrated circuit.

The exemplary methods described above for manufacturing low-profile electronic devices and flexible electronics devices may be used in implantable biomedical devices, renewable energy devices, biomimic-robotic devices, and/or flexible displays. The low-profile device manufacturing process allows construction of devices with little to no modification of manufacturing processes to accommodate for thin wafers. Additionally, the exemplary processes reduce wasted materials by allowing for multiple integrated circuits to be manufactured from a single wafer.

Figure 4:
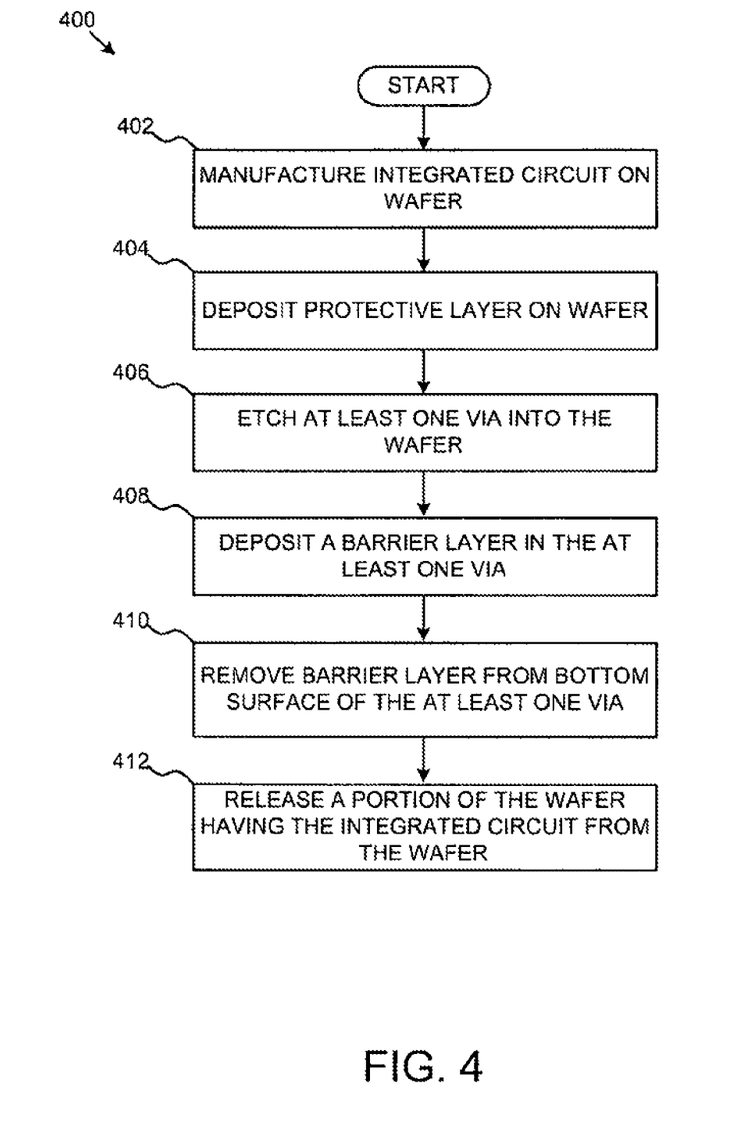
FIG. 4 is a flow chart illustrating an exemplary manufacturing process for manufacturing low-profile integrated circuits according to one embodiment of the disclosure.
Figure 5D:
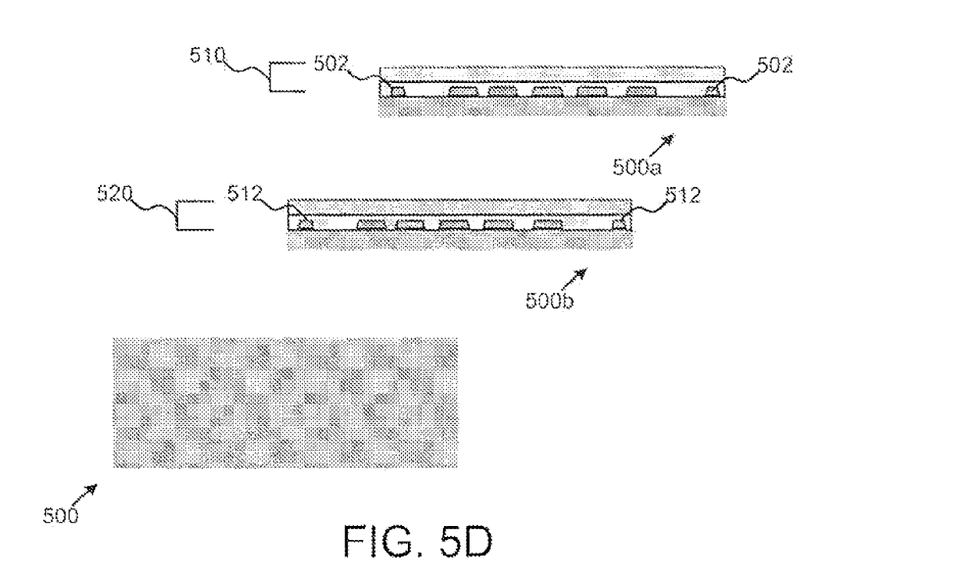

The schematic flow chart diagrams of FIGS. 4 and 6 are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

The invention claimed is:

1. A method, comprising:
    manufacturing an integrated circuit on at least a portion of a surface of a wafer, wherein the wafer comprises a bulk portion below the surface of the wafer;
    etching at least one via into the wafer and extending into the bulk portion of the wafer; and
    releasing at least the portion of the wafer having the integrated circuit from a bulk portion of the wafer by etching through the bulk portion of the wafer.

2. The method of claim 1, in which etching the at least one via comprises etching the at least one via through an area of the wafer occupied by the integrated circuit.

3. The method of claim 1, further comprising:
    depositing a barrier layer on at least portions of the wafer exposed in the at least one via; and
    etching the barrier layer from a bottom surface of the at least one via before the releasing step.

4. The method of claim 3, in which the step of releasing at least the portion of the wafer comprises isotropically etching the wafer from the bottom surface of the at least one via.

5. The method of claim 4, in which the step of isotropically etching the wafer comprises etching the wafer with xenon difluoride ($XeF_2$).

6. The method of claim 4, in which the step of isotropically etching the wafer comprises isotropically etching a silicon wafer having a <100> crystal lattice.

7. The method of claim 3, in which the step of depositing the barrier layer comprises growing a thermal oxide.

8. The method of claim 1, in which the step of etching the at least one via into the wafer comprises deep reactive ion etching (DRIE).

9. The method of claim 1, further comprising manufacturing a second integrated circuit on at least a portion of the bulk portion of the wafer.

10. The method of claim 9, further comprising:
    etching at least one via into the second integrated circuit; and
    releasing at least the portion of the wafer having the second manufactured integrated circuit.

11. The method of claim 1, further comprising depositing a protective layer on the wafer before etching the at least one via in the wafer.

12. The method of claim 11, in which the step of depositing the protective layer comprises depositing at least one of a silicon oxide and a silicon nitride.

13. The method of claim 1, further comprising packaging the integrated circuit.

14. The method of claim 1, in which the step of manufacturing the integrated circuit comprises manufacturing at least one of implantable biomedical devices, renewable energy devices, biomimic-robotic devices, and flexible displays.

15. A method, comprising:
    manufacturing a first integrated circuit on a wafer, wherein the wafer comprises a bulk portion below the surface of the wafer;
    releasing a first thickness of the wafer including the first integrated circuit from the wafer by etching through a bulk portion of the wafer;
    manufacturing a second integrated circuit on the wafer; and
    releasing a second thickness of the wafer including the second integrated circuit from the wafer by etching through the bulk portion of the wafer.

16. The method of claim 15, in which the step of releasing the first thickness of the wafer comprises:
    etching at least one via into the wafer;
    depositing a barrier layer on exposed surfaces of the at least one via;
    removing the barrier layer from a bottom surface of the at least one via; and
    isotropically etching the wafer through the bottom surface of the at least one via.

17. The method of claim 15, further comprising:
    manufacturing a third integrated circuit on the wafer; and
    packaging the third integrated circuit without releasing the third integrated circuit from the wafer.

18. The method of claim 15, in which the step of manufacturing the second integrated circuit comprises manufacturing a second integrated circuit different from the first integrated circuit.

19. The method of claim 15, further comprising packaging the first integrated circuit and the second integrated circuit.

20. The method of claim 15, in which the step of manufacturing the first integrated circuit comprises manufacturing at least one of implantable biomedical devices, renewable energy devices, biomimic-robotic devices, and flexible displays.

* * * * *

UNITED STATES PATENT AND TRADEMARK OFFICE
CERTIFICATE OF CORRECTION

| | | |
|---|---|---|
| PATENT NO. | : 9,209,083 B2 | Page 1 of 1 |
| APPLICATION NO. | : 14/232211 | |
| DATED | : December 8, 2015 | |
| INVENTOR(S) | : Hussain et al. | |

It is certified that error appears in the above-identified patent and that said Letters Patent is hereby corrected as shown below:

In the claims

Claim 15, Column 8, Line 21:

Delete "water" and replace with -- wafer --.

Signed and Sealed this
Twenty-ninth Day of March, 2016

Michelle K. Lee
*Director of the United States Patent and Trademark Office*